(12) United States Patent
Gupta et al.

(10) Patent No.: US 7,868,305 B2
(45) Date of Patent: Jan. 11, 2011

(54) TECHNIQUE FOR ION BEAM ANGLE SPREAD CONTROL

(75) Inventors: Atul Gupta, Beverly, MA (US); Joseph C. Olson, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 291 days.

(21) Appl. No.: 11/145,949

(22) Filed: Jun. 7, 2005

(65) Prior Publication Data

US 2006/0208202 A1  Sep. 21, 2006

Related U.S. Application Data

(60) Provisional application No. 60/661,938, filed on Mar. 16, 2005.

(51) Int. Cl.
*H01J 37/302* (2006.01)
(52) U.S. Cl. ............... 250/492.21; 250/492.2; 250/396 R
(58) Field of Classification Search ............. 250/492.21
See application file for complete search history.

(56) References Cited

U.S. PATENT DOCUMENTS

| | | | |
|---|---|---|---|
| 4,847,504 A * | 7/1989 | Aitken ................ | 250/492.2 |
| 5,013,673 A | 5/1991 | Fuse | |
| 5,099,130 A * | 3/1992 | Aitken ................ | 250/396 R |
| 5,132,544 A * | 7/1992 | Glavish .............. | 250/492.2 |
| 5,892,235 A * | 4/1999 | Yamazaki et al. .... | 250/492.21 |
| 6,229,148 B1 | 5/2001 | Prall et al. | |
| 6,437,350 B1 | 8/2002 | Olson et al. | |
| 6,633,046 B1 * | 10/2003 | Mitchell et al. ...... | 250/492.21 |
| 6,791,094 B1 | 9/2004 | Olson et al. | |
| 6,806,479 B1 | 10/2004 | Wan et al. | |
| 6,807,519 B2 * | 10/2004 | Stanton .............. | 703/2 |
| 2002/0121889 A1 | 9/2002 | Larsen et al. | |
| 2004/0063262 A1 | 4/2004 | Feudel et al. | |
| 2005/0082498 A1 | 4/2005 | White | |

FOREIGN PATENT DOCUMENTS

WO  WO0219374 A  3/2002

OTHER PUBLICATIONS

Campbell, et al., "Beam Angle Control on the VIISTa 80 Ion Implanter," IIT Proceedings, 2002, pp. 193-196.

* cited by examiner

*Primary Examiner*—Phillip A Johnston

(57) ABSTRACT

A technique for ion beam angle spread control is disclosed. In one particular exemplary embodiment, the technique may be realized as a method for ion beam angle spread control. The method may comprise directing one or more ion beams at a substrate surface at two or more different incident angles, thereby exposing the substrate surface to a controlled spread of ion beam incident angles.

19 Claims, 20 Drawing Sheets

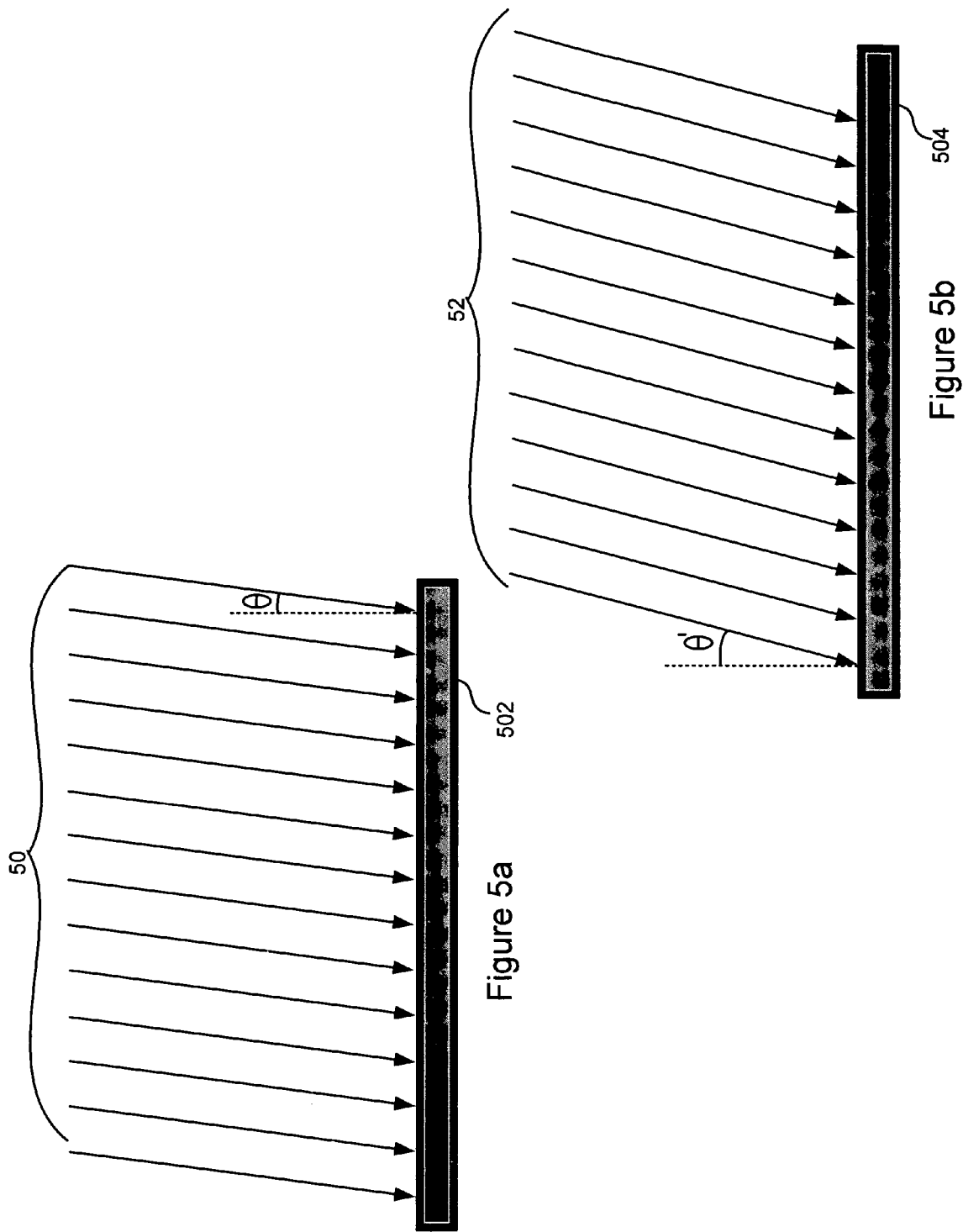

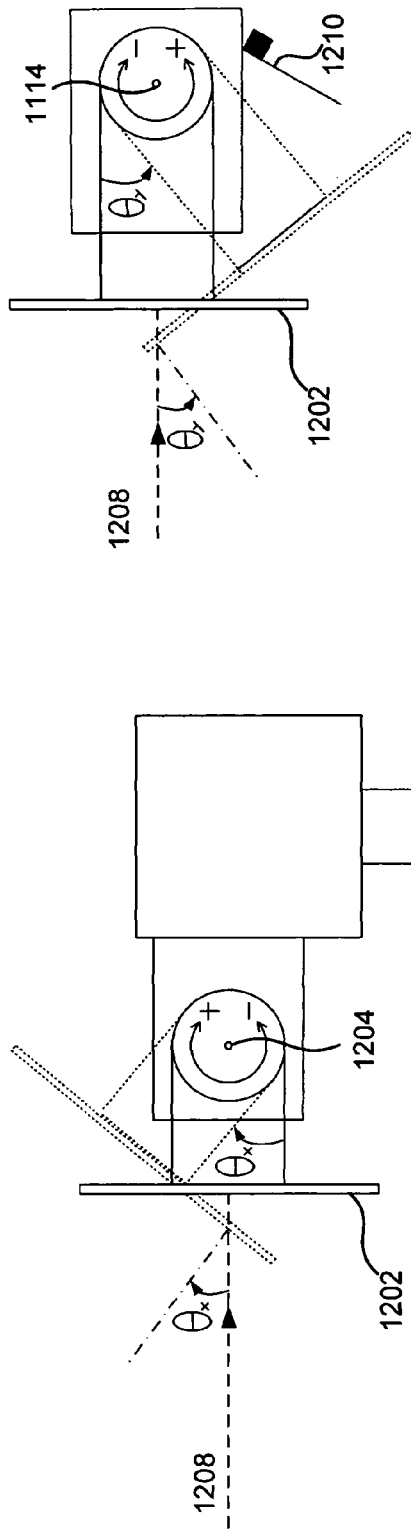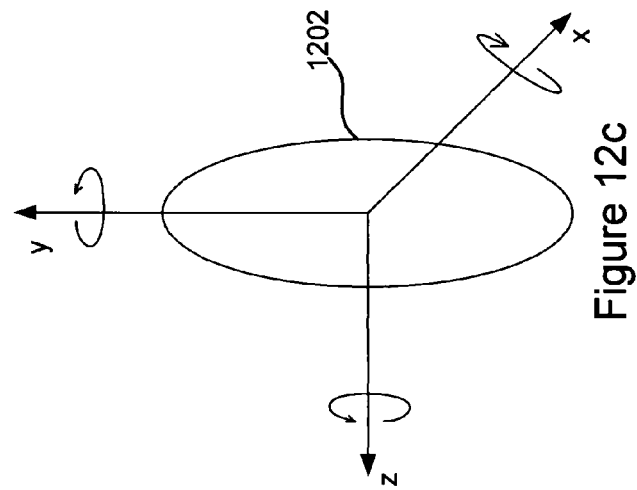
Figure 12b
Figure 12c
Figure 12a

TECHNIQUE FOR ION BEAM ANGLE SPREAD CONTROL

CROSS-REFERENCE TO RELATED APPLICATIONS

This patent application claims priority to U.S. Provisional Patent Application No. 60/661,938, filed Mar. 16, 2005, which is hereby incorporated by reference herein in its entirety.

FIELD OF THE DISCLOSURE

The present disclosure relates generally to semiconductor equipment and, more particularly, to a technique for ion beam angle spread control.

BACKGROUND OF THE DISCLOSURE

Ion implantation is a process of depositing chemical species into a substrate by direct bombardment of the substrate with energized ions. In semiconductor fabrication, ion implanters are used primarily for doping processes that alter the type and level of conductivity of target materials. A precise doping profile in an integrated circuit (IC) substrate and its thin-film structure is often crucial for proper IC performance. To achieve a desired doping profile, one or more ion species may be implanted in different doses and at different energy levels. A specification of the ion species, doses and energies is referred to as an ion implantation recipe.

FIG. 1 depicts a prior art ion implanter system 100. As is typical for most ion implanter systems, the system 100 is housed in a high-vacuum environment. The ion implanter system 100 may comprise an ion source 102 and a complex series of components through which an ion beam 10 passes. The series of components may include, for example, an extraction manipulator 104, a filter magnet 106, an acceleration or deceleration column 108, an analyzer magnet 110, a rotating mass slit 112, a scanner 114, and a corrector magnet 116. Much like a series of optical lenses that manipulate a light beam, the ion implanter components can filter and focus the ion beam 10 before steering it towards a target substrate 118. For illustration purposes, these components are often referred to as "beam-line elements."

In production, semiconductor wafers are typically scanned with an ion beam. For example, as illustrated in FIG. 2, a ribbon-shaped ion beam 202 may be kept stationary while a series of wafers 204 may flow along a line 20 and across the ribbon-shaped ion beam. Alternatively, as illustrated in FIG. 3, a spot beam 302 may be scanned back and forth between two endpoints 308 and 310 forming a beam path 30, while a series of wafers 304 may flow along a line 32 across the beam path 30. As used hereinafter, "scanning" of an ion beam refers to the relative movement of an ion beam with respect to a wafer or substrate surface.

In a traditional ion implanter system, an ion beam is typically tuned to have a specified incident angle on a substrate surface, and any spread of the incident angle of the single ion beam is usually minimized or simply ignored. However, in reality, the ion beam does not always strike a target substrate exactly at the specified angle, and the ion beam often has a finite angle spread that is not negligible. As shown in FIG. 4a, a ribbon-shaped ion beam 400 typically comprises a plurality of beamlets 404. Due to beam emittance and/or divergence, the beamlets 404 may strike a substrate surface 402 at different incident angles. Thus, the substrate surface 402 is exposed to an intrinsic spread of ion beam incident angles. Further, as shown in FIG. 4b, each beamlet 404 may also have an intrinsic spread of incident angles due to space-charge effect, for example. That is, ions that form the beamlet travel in an average direction but spread out according to a Gaussian-like distribution around the average direction. Similarly, a typical spot beam may also have an intrinsic angle spread, and, due to beam steering errors, the spot beam may not strike its target at exactly the specified incident angle.

Ion beam incident angles and intrinsic angle spread may cause angle variations in the ion implantation process. There are typically three types of angle variations, whose causes and effects are illustrated in FIGS. 5-7 respectively.

FIGS. 5a and 5b illustrate wafer-to-wafer (or inter-wafer) angle variations, wherein wafers 502 and 504 are different wafers separately processed based on the same recipe in the same ion implanter system. Due to small differences in the setups of the ion implanter system and/or beam steering errors, the wafer 502 may be implanted with an ion beam 50 incident at a first angle θ, while wafer 504 may be implanted with an ion beam 52 incident at a second angle θ', wherein θ≠θ. θ and θ' are "angle errors" measured with respect to a nominal direction of the wafer surface. In the description that follows, the angle errors are shown as being measured with respect to the normal incidence of the wafer surface. However, in general, such angle errors may be measured with respect to any predetermined angle. The angle errors typically affect all structures on the wafers 502 and 504, and the angle difference can cause wafer-to-wafer variations in device performance. The ion beams 50 and 52 may also have different intrinsic angle spreads which may cause additional doping variations between the two wafers.

FIG. 6 illustrates within-wafer (or intra-wafer) angle variations, wherein different parts of a wafer 602 may experience different ion beam incident angles ($\theta_1$, $\theta_2$, and $\theta_3$, etc.) due to intrinsic angle spread within an ion beam 60, for example. Alternatively, a wafer with an irregular surface (e.g., concave or convex surface) may have significant intra-wafer angle variations even when it is exposed to a perfectly parallel ion beam (i.e., an ion beam with zero angle spread). While the beam current non-uniformities may be averaged out by scanning the ion beam across the wafer, for example, the ion beam incident angles in different parts of the substrate may remain uncontrolled such that the angle spread is narrow locally (i.e., at any part of the substrate) but still varies from one location to another. Such intra-wafer angle variations can cause significant performance variations for devices located in different parts of the same wafer.

FIG. 7 illustrates device-level angle variations. As shown, a first ion beam 70 and a second ion beam 72, with or without an angle error, may cause a trench 702 or a mesa 704 to see a spread of incident angles. As a result, the bottom of the trench 702 may have a different dopant profile from its sidewalls. And each sidewall of the trench 702 may have a different dopant profile from another. Similarly, the mesa 704 may have one side more heavily doped than an opposite side. For certain applications, such an asymmetrical dopant profile may not be acceptable.

The above-described angle variations may cause a number of problems if the ion beam incident angles and/or angle spread are not properly controlled in the implantation and doping processes.

One such problem may arise in the context of "conformal doping," where a uniform dopant profile is desired in a substrate with irregular surface topology. Prior methods for conformal doping start by depositing a dopant-containing film on a substrate surface. Then, some post-implant processing, such as thermal diffusion, is required to drive the dopants into the substrate. To achieve a uniform dopant profile, the prior methods typically focus on improving the uniformity of the thermal drive-in process. Since such methods rely on thermal diffusion, they are limited by thermal budget constraints for each doping step in the process sequence.

FIGS. 8a and 8b illustrate another problem that may be caused by ion beam angle variations. FIG. 8a depicts an ion beam 80 with zero angle error and a small angle spread. The ion beam 80 is used to dope a substrate surface 802, a part of which is masked by a structure 804 (e.g., a gate stack) having vertical sidewalls. Since the ion beam 80 is aligned with the sidewalls, the resulting dopant profiles 82 and 84 on either side of the structure 804 are symmetric. If, however, the ion beam 80 has a small angle error as shown in FIG. 8b, the shadowing effect from the structure 804 causes the resulting dopant profiles 86 and 88 to be highly asymmetrical to the extent that the shadowed side becomes useless.

Note that the structure 804 may be just one of the devices in the substrate 802 whose topology makes it sensitive to ion beam angle variations (e.g., beam steering errors and angle spreads). If the angle error and/or angle spread of the ion beam 80 are not properly controlled, similar yet varying effects may be seen across different parts of the substrate 802 or across different wafers. As the device feature size continues to shrink, the device-level, wafer-level, and wafer-to-wafer angle variations, if left uncontrolled, may cause more performance variations and other detrimental effects.

The ion beam angle variations may also cause process repeatability problems in an ion implanter system. As described above, uncontrolled ion beam incident angles and angle spread may cause significant performance variations among different wafers processed in the same implanter. Existing methods for setting up an ion implanter system have been focused on the repeatability of implant doses. In terms of ion beam incident angle, the existing approach has been limited to the correction of average incident angles only. No known method manages to achieve a true process repeatability with respect to ion beam incident angles as well as implant doses.

In view of the foregoing, it would be desirable to provide a solution for ion beam implant control which overcomes the above-described inadequacies and shortcomings.

SUMMARY OF THE DISCLOSURE

A technique for ion beam angle spread control is disclosed. In one particular exemplary embodiment, the technique may be realized as a method for ion beam angle spread control. The method may comprise directing one or more ion beams at a substrate surface at two or more different incident angles, thereby exposing the substrate surface to a controlled spread of ion beam incident angles.

In accordance with other aspects of this particular exemplary embodiment, the two or more incident angles may be introduced by deflecting at least one of the one or more ion beams with a varying magnetic field. Alternatively, the two or more incident angles may be introduced by deflecting at least one of the one or more ion beams with a varying electrostatic field. Or the two or more incident angles may be introduced by tilting the substrate plane to two or more different angles with respect to at least one of the one or more ion beams.

In accordance with further aspects of this particular exemplary embodiment, the method may further comprise rotating the substrate surface to one or more predetermined orientations.

In accordance with additional aspects of this particular exemplary embodiment, the two or more different incident angles may be introduced during one or more scans of the substrate surface. The two or more different incident angles may comprise substantially continuous ion beam incident angles. Or the two or more different incident angles may comprise incrementally varied ion beam incident angles.

In accordance with another aspect of this particular exemplary embodiment, the method may comprise scanning an ion beam at a first rate across the substrate surface and varying an incident angle associated with the ion beam at a second rate that is substantially faster than the first rate.

In accordance with yet another aspect of this particular exemplary embodiment, the method may comprise scanning two or more ion beams simultaneously across the substrate surface, wherein each of the two or more ion beams strike the substrate surface at a predetermined incident angle.

In another particular exemplary embodiment, the technique may be realized by at least one signal embodied in at least one carrier wave for transmitting a computer program of instructions configured to be readable by at least one processor for instructing the at least one processor to execute a computer process for performing the method as recited above.

In yet another particular exemplary embodiment, the technique may be realized by at least one processor readable carrier for storing a computer program of instructions configured to be readable by at least one processor for instructing the at least one processor to execute a computer process for performing the method as recited above.

In still another particular exemplary embodiment, the technique may be realized by a system for ion beam angle spread control. The system may comprise means for directing one or more ion beams at a substrate surface at two or more different incident angles, thereby exposing the substrate surface to a controlled spread of ion beam incident angles.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

FIGS. 5a and 5b illustrate exemplary wafer-to-wafer angle variations.

FIGS. 12a-c illustrate another exemplary method for controlling ion beam incident angles in accordance with an embodiment of the present disclosure.

DETAILED DESCRIPTION OF EXEMPLARY EMBODIMENTS

To reduce or overcome the above-identified and other deficiencies in existing ion implanter systems, a controlled spread of ion beam incident angles may be introduced or maintained in an ion implantation process, or ion beam angle variations may be otherwise controlled, based on specific applications. According to embodiments of the disclosure, one or more ion beams may be caused to strike a substrate surface at two or more different incident angles, thereby exposing the substrate surface to a controlled spread of ion beam incident angles. As used hereinafter, an "angle spread" refers to a distribution of ion beam incident angles seen by a portion of a substrate surface (e.g., one or more devices or structures), a single wafer, or multiple wafers.

Figure 9:
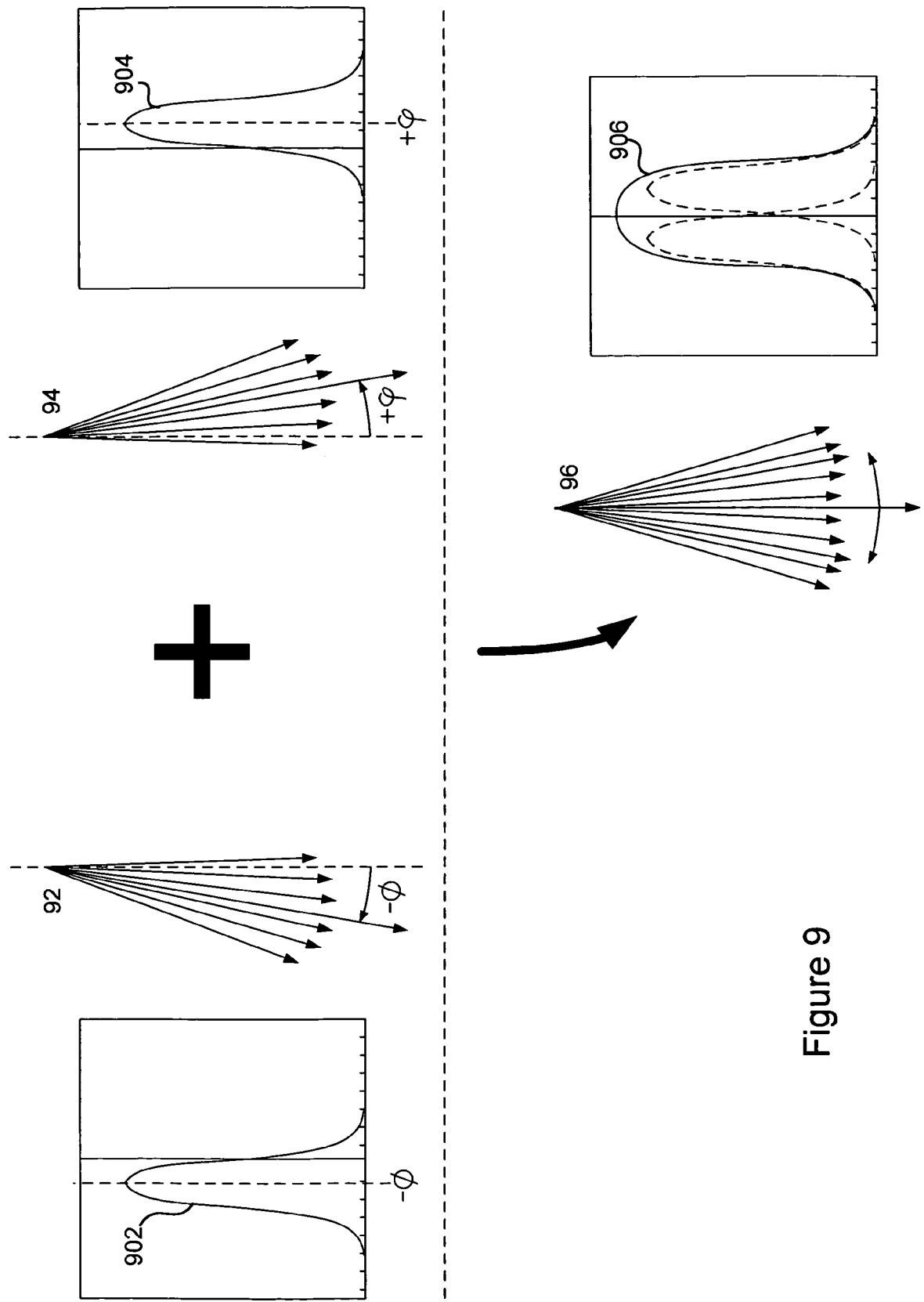
FIG. 9 illustrates an exemplary method for ion beam angle spread control in accordance with an embodiment of the present disclosure.

FIG. 9 illustrates a method for ion beam angle spread control in accordance with an embodiment of the present disclosure. A substrate surface may be scanned with a first ion beam 92 which has a small angle error (or average incident angle) $-\phi$ and a predetermined angle spread as illustrated by a waveform 902. The substrate surface may be scanned with a second ion beam 94 which has a small angle error (or average incident angle) $+\phi$ and a predetermined angle spread as illustrated by a waveform 904. Though drawn as separate ion beams for illustration purposes, the first ion beam 92 and the second ion beam 94 may represent two states of a same ion beam. That is, scanning of the substrate surface with the two incident angles may be achieved with either a single ion beam or multiple ion beams, and in either a single scan pass or multiple scan passes. For example, a single ion beam may be caused to scan the substrate surface multiple times where the ion beam incident angle may switch between the incident angles $-\phi$ and $+\phi$ after each scan pass. Alternatively, the single ion beam may scan the substrate surface in only one scan pass. During the single scan pass, the beam angle may alternate between the incident angles $-\phi$ and $+\phi$ at a frequency substantially faster than the scan velocity, such that it simulates the substrate surface being scanned simultaneously with two ion beams having two different incident angles. In another embodiment, two separate ion beams maintained at the two incident angles $-\phi$ and $+\phi$ respectively may be used to scan the substrate surface.

The combined effect of the first ion beam 92 and the second ion beam 94 may be equivalent to that of an ion beam 96 with a smaller average incident angle and/or a wider angle spread as illustrated by waveform 906. That is, the substrate surface that has been subject to the two incident angles may, in aggregate, experience a reduced angle error and/or a larger yet more controlled angle spread. Though only two ion beams are illustrated in FIG. 9, it should be noted that multiple ion beams may be used to achieve a desired angle spread.

Figure 1:
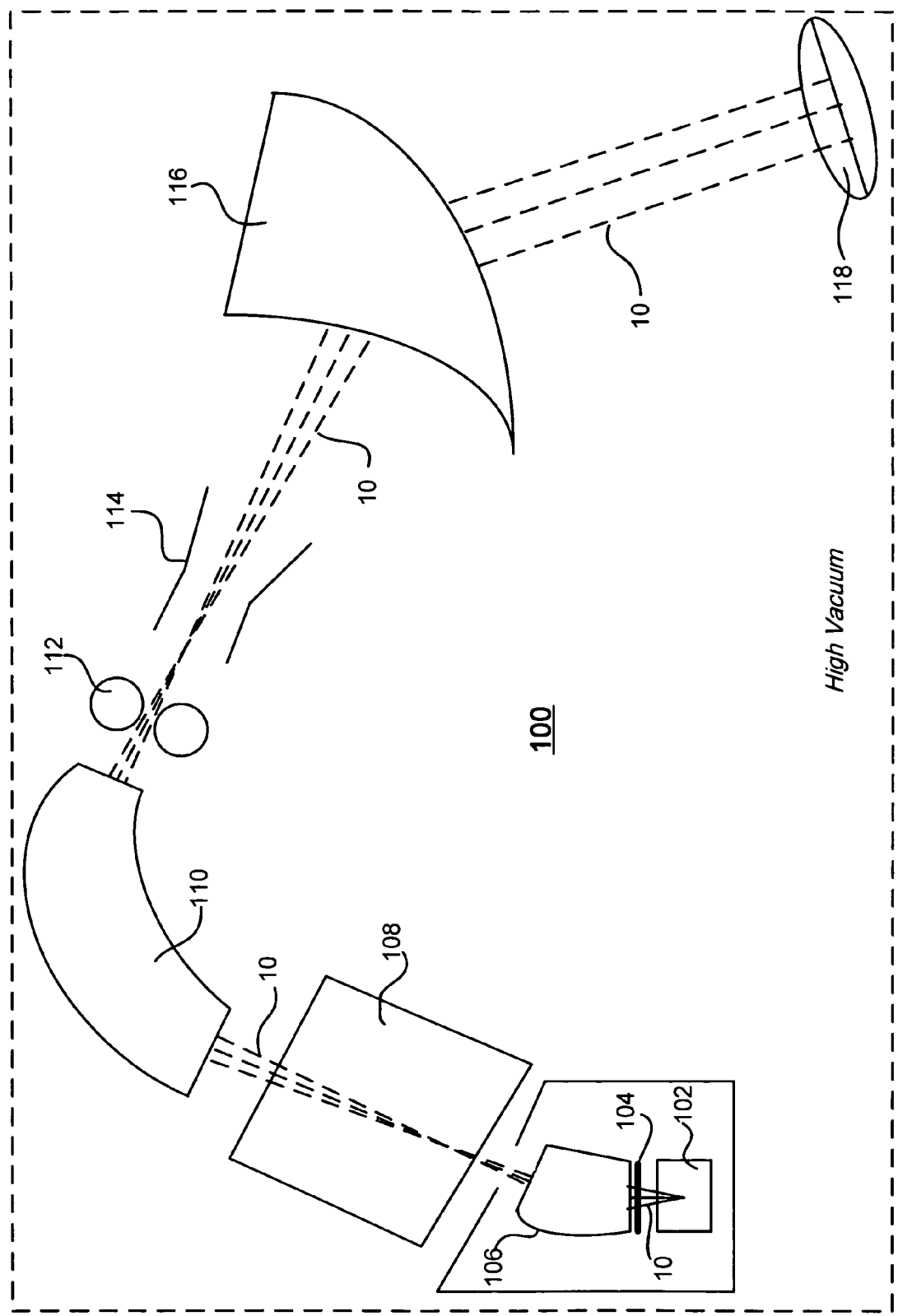
FIG. 1 is a diagram illustrating a prior art ion implanter system.
Figure 2:
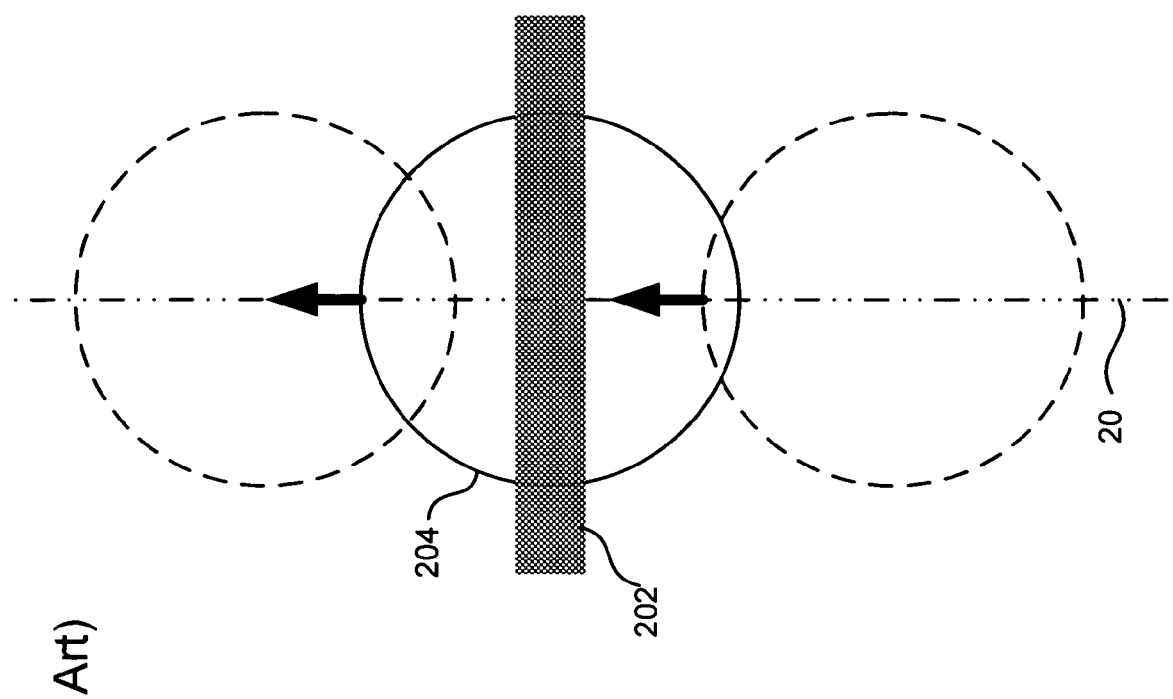
FIG. 2 illustrates a prior art method for scanning wafers with a ribbon-shaped ion beam.
Figure 3:
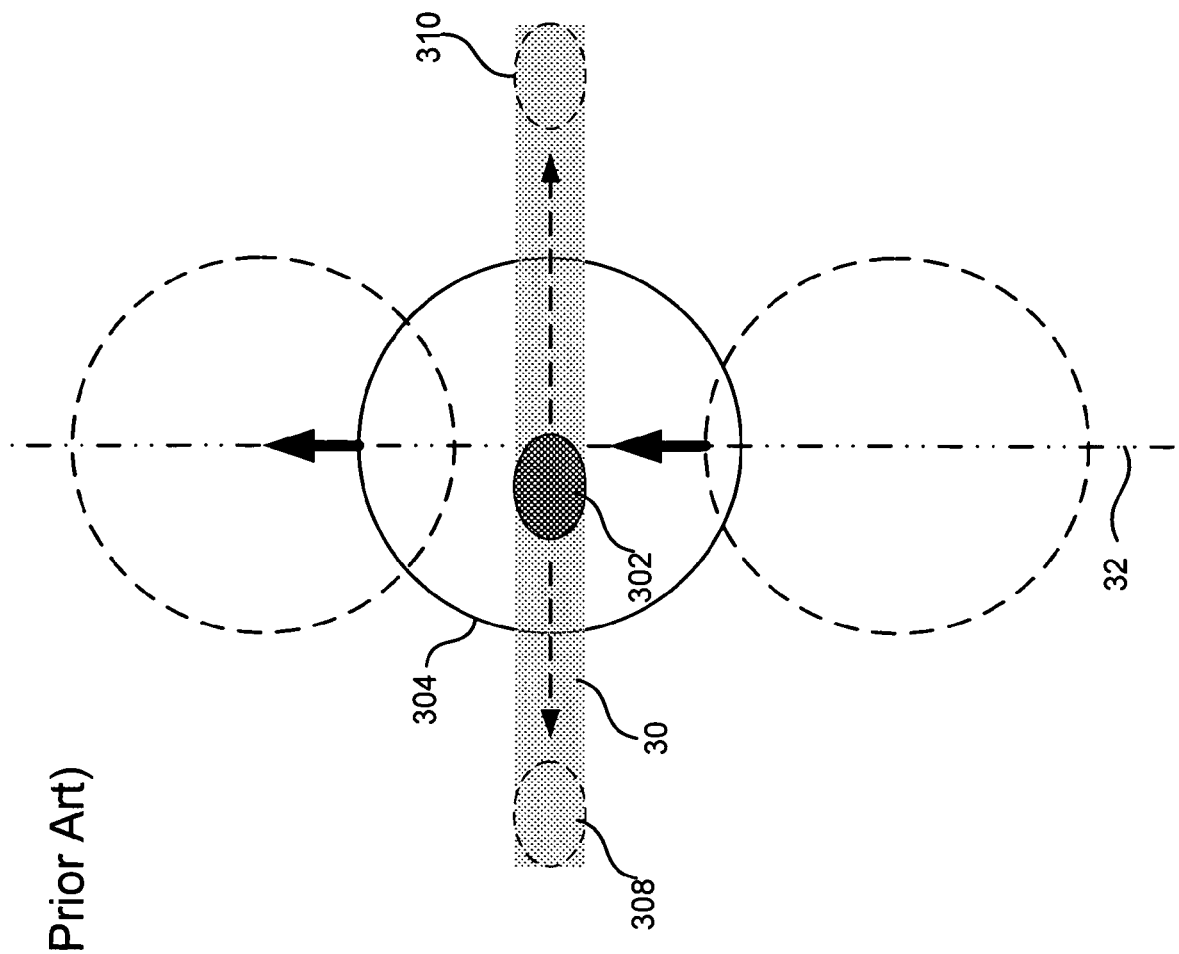
FIG. 3 illustrates a prior art method for scanning wafers with a spot beam.
Figures 4A, 4B:
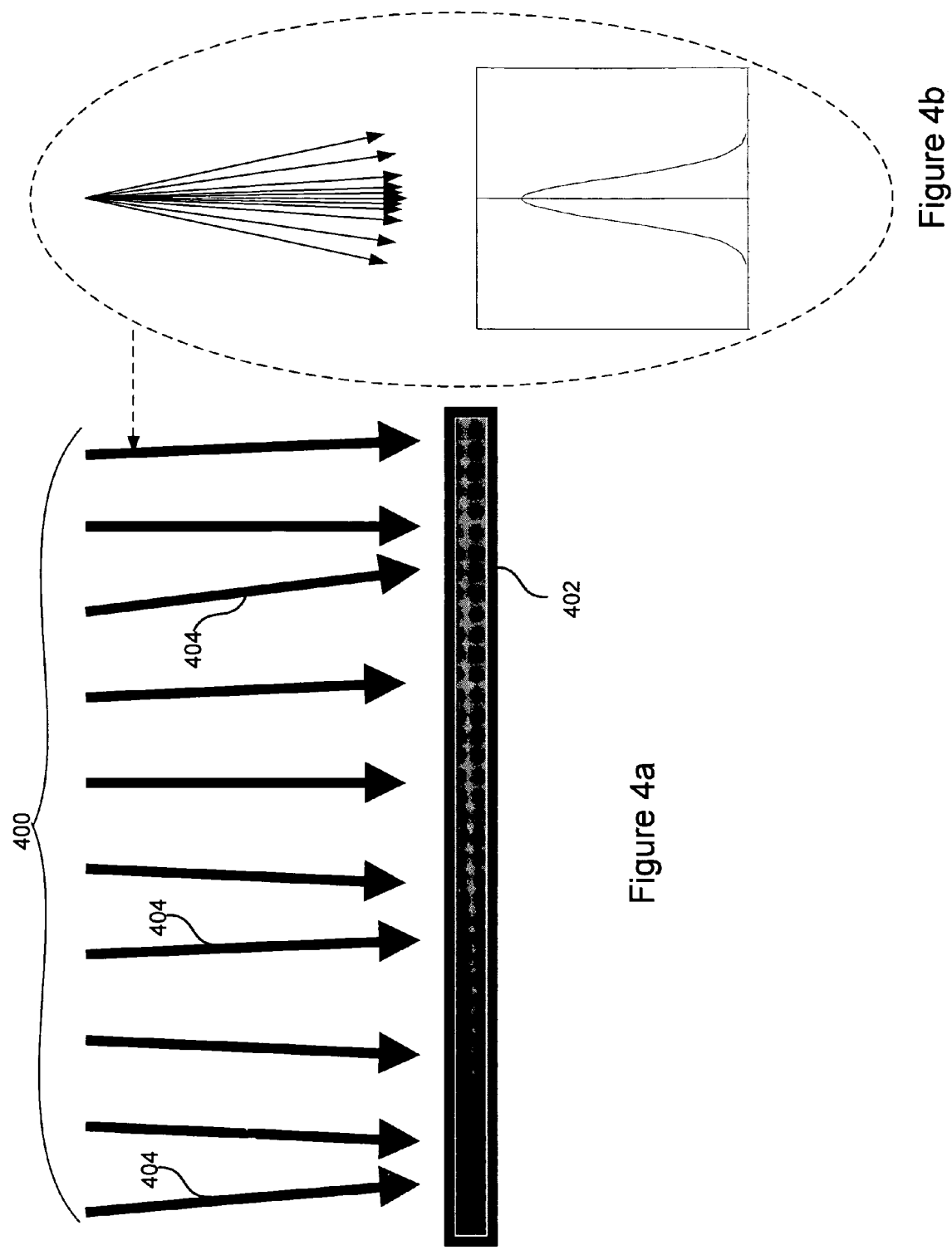
FIGS. 4a and 4b illustrate intrinsic angle spreads for a ribbon-shaped beam and beamlets.
Figure 6:
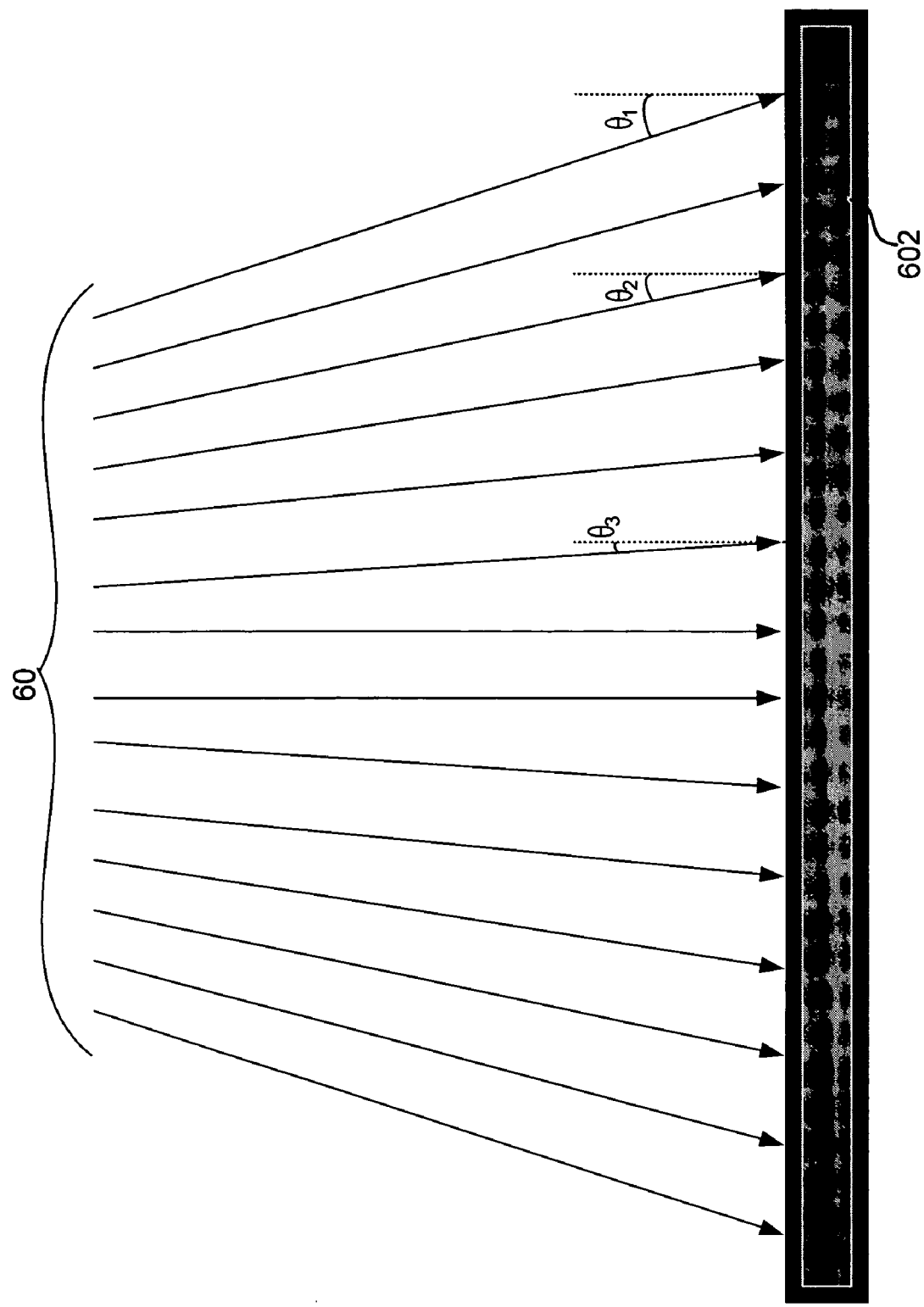
FIG. 6 illustrates exemplary intra-wafer angle variations.
Figure 7:
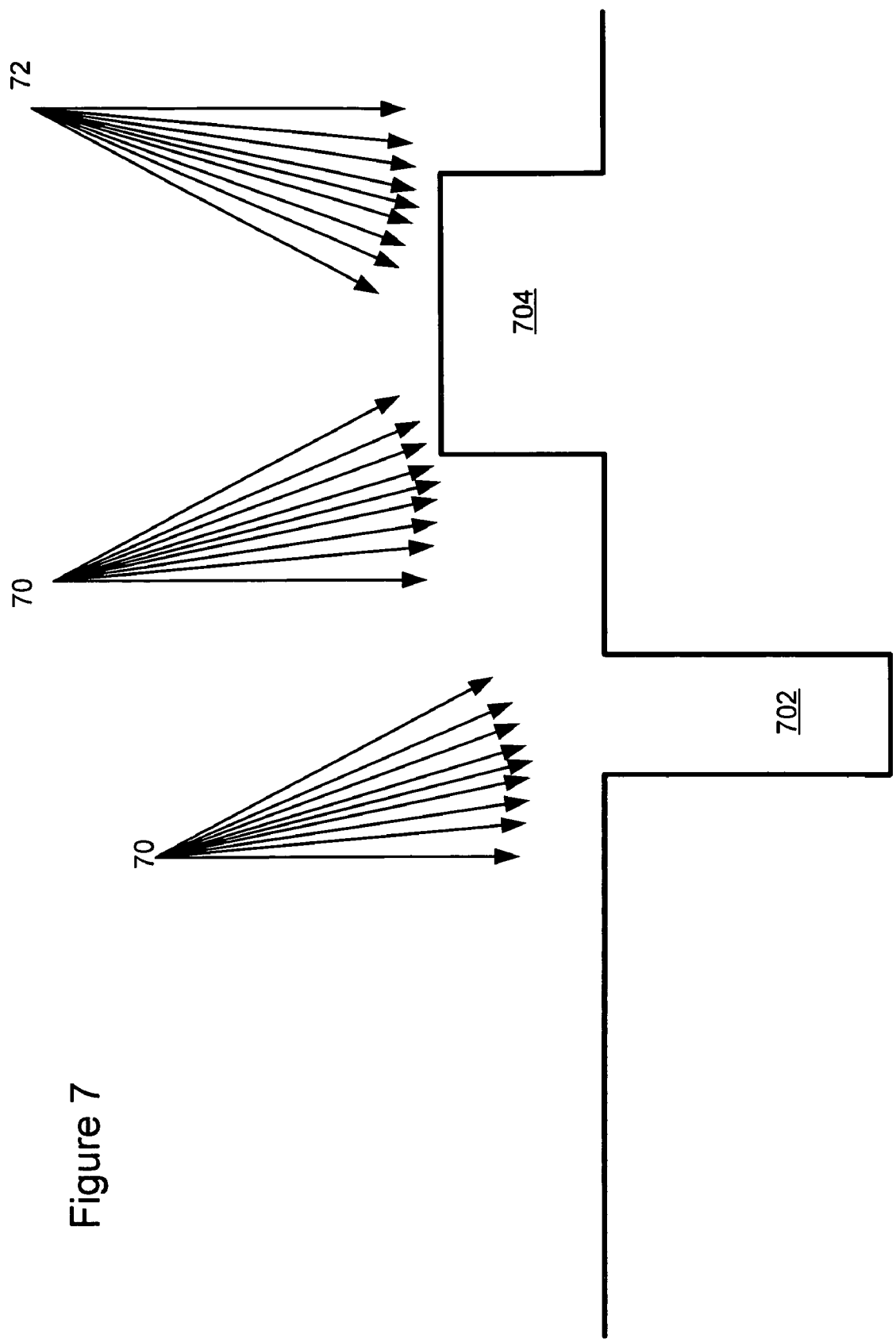
FIG. 7 illustrates exemplary device-level angle variations.
Figure 8A:
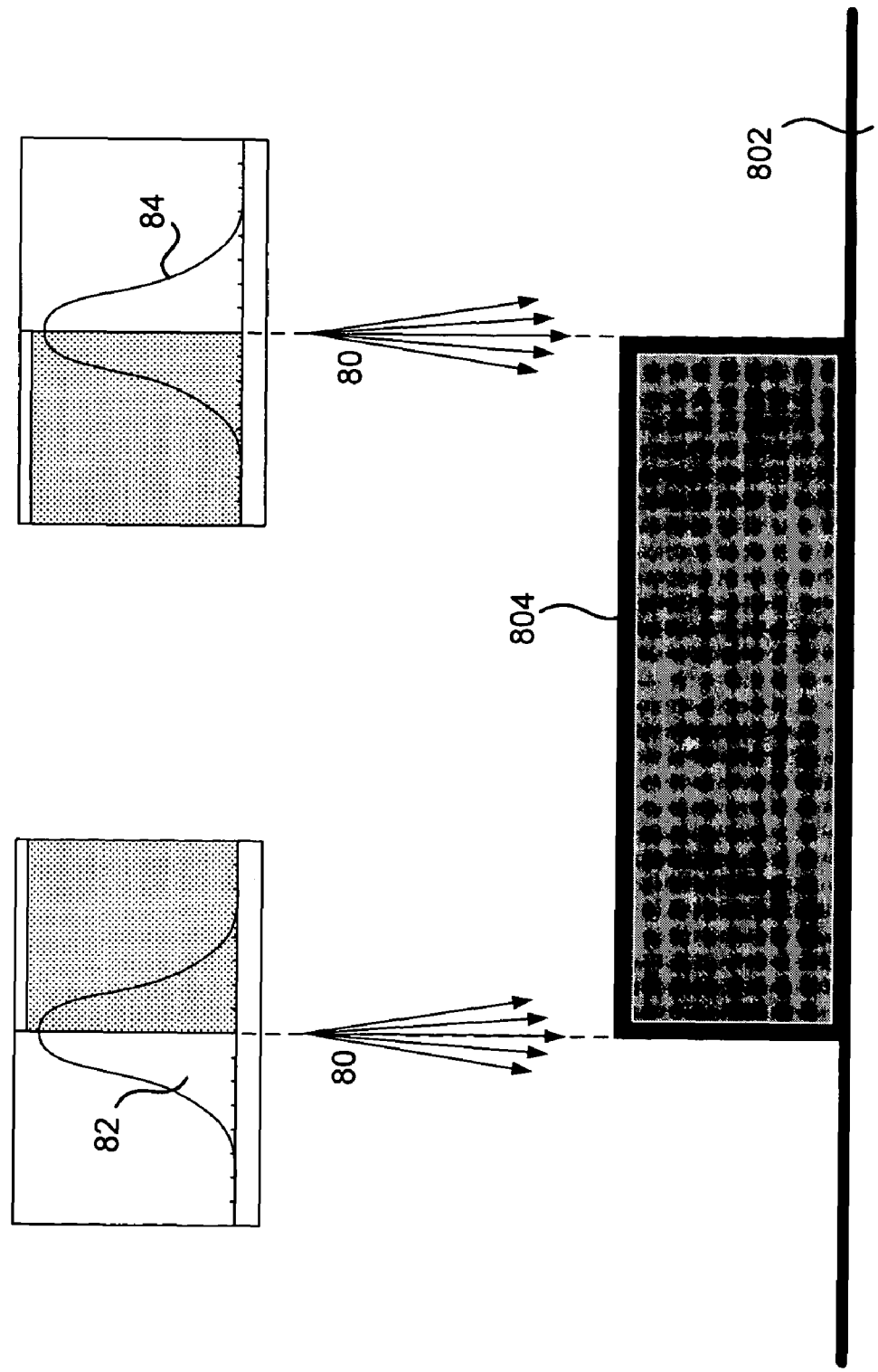
FIGS. 8a and 8b illustrate a shadowing effect caused by ion beam angle variations.
Figure 8B:
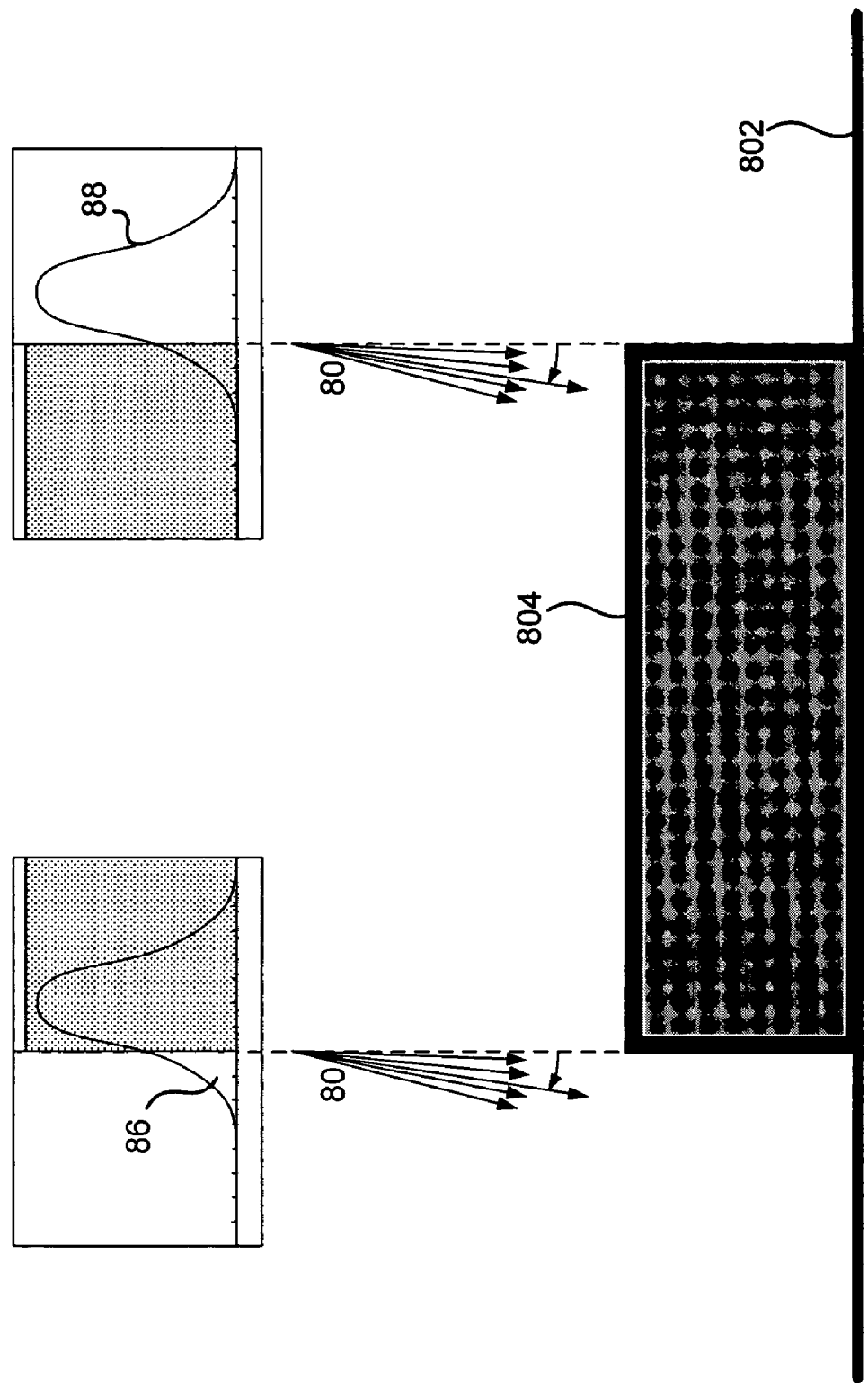
Figure 10:
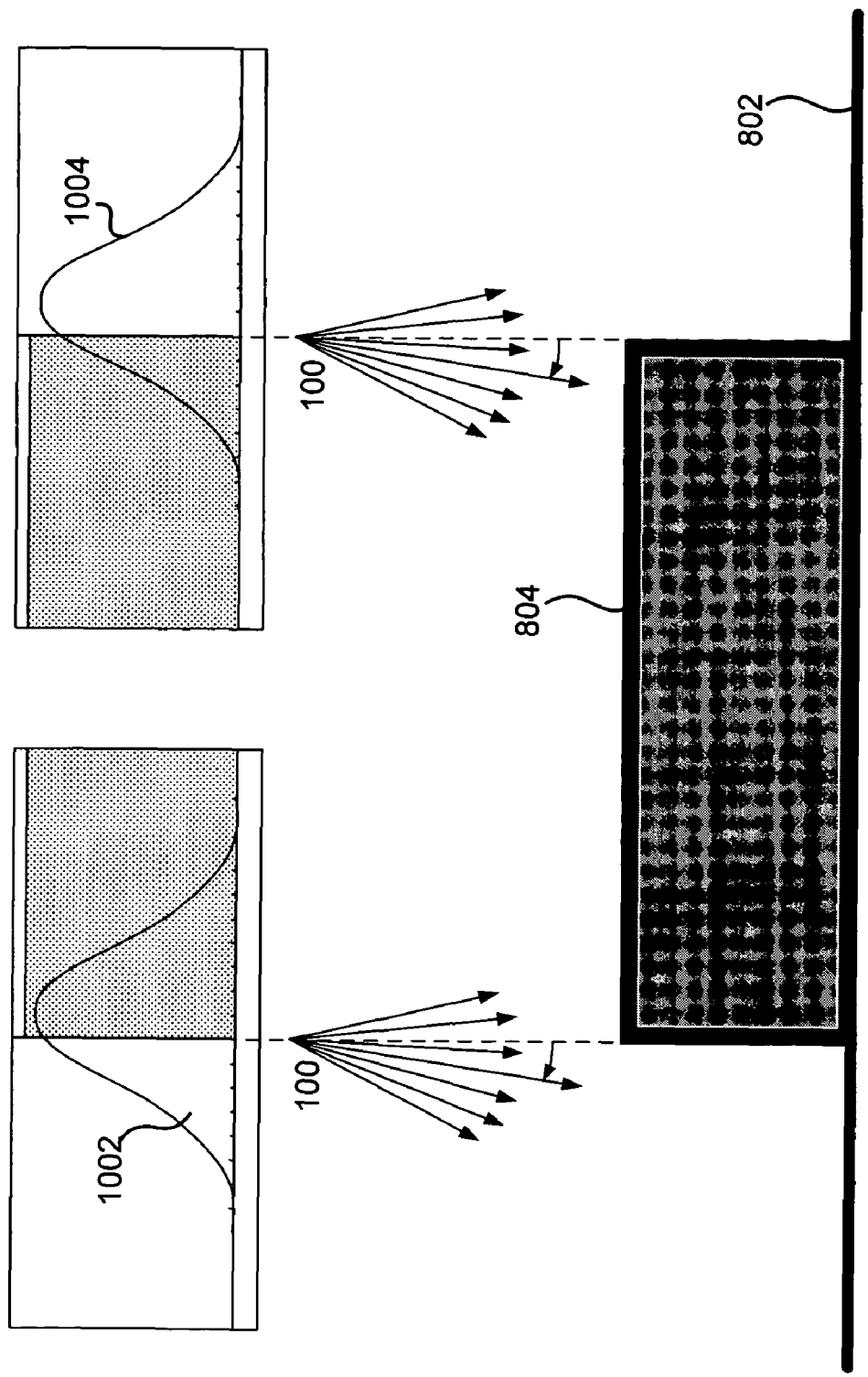
FIG. 10 illustrates an exemplary effect of a controlled ion beam angle spread in accordance with an embodiment of the present disclosure.

One advantage of a larger angle spread may be seen in FIG. 10 which illustrates a same substrate surface 802 and structure 804 as shown in FIGS. 8a and 8b. An ion beam 100 in FIG. 10 may have the same small angle error as the ion beam 80 in FIG. 8b. The only difference may be that the ion beam 100 has a larger angle spread than the ion beam 80. As illustrated in the angle distributions 1002 and 1004, the larger angle spread reduces the shadowing effect (since a larger fraction of the angular distribution is now useful for implantation), and therefore causes the resulting dopant profiles to be more symmetric. As a result of the larger yet controlled angle spread, doping process of the area around the structure 804 has become less sensitive to the angle error or beam steering errors.

Figure 19:
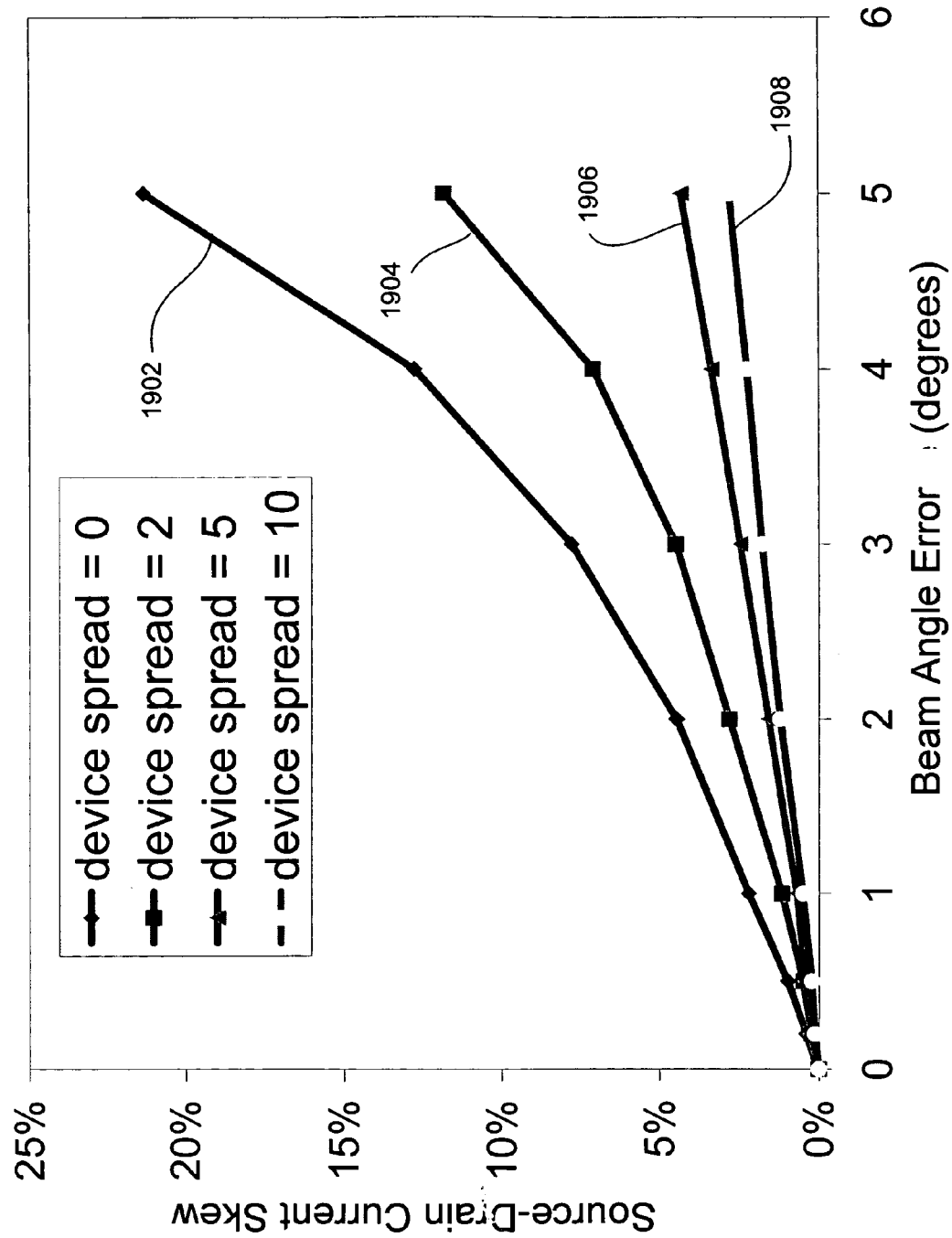
FIG. 19 illustrates an effect of ion beam angle spread on device performance in accordance with an embodiment of the present disclosure.

Another advantage of a larger angle spread is illustrated in FIG. 19 where ion beams with different incident angles and angle spreads are compared based on their effect on the resulting device performance. The performance parameter compared in FIG. 19 is the source-drain current skew of a transistor device whose source and drain regions are implanted with the ion beams with different beam angle conditions. The source-drain current skew is defined as a difference between the source-to-drain current and the drain-to-source current divided by the average value of the two currents. Curve 1902 shows current skew values resulting from ion beams with zero angle spread. Curve 904 shows current skew values resulting from ion beams with 2-degree angle spread. Curve 1906 shows current skew values resulting from ion beams with 5-degree angle spread. Curve 1908 shows current skew values resulting from ion beams with 10-degree angle spread. These curves exhibit two notable trends: (1) the current skew increases monotonically with the angle error; and (2) for each given angle error, as the device-level angle spread increases, the current skew decreases. That is, a larger angle spread can help mask the effect of beam angle errors.

The controlled angle spread may also improve intra-wafer and inter-wafer implant uniformity. For example, for conformal doping of a highly irregular substrate surface, a larger yet controlled angle spread may produce a more even distribution of dopants in non-planar structures on the substrate surface.

A number of techniques may be employed to control and vary the ion beam incident angles. According to one approach, the ion beam may be deflected to desired angles by one or more beam-line elements in the beam path. The deflection of the ion beam may be achieved by changing one or more electrostatic fields, or one or more magnetic fields, or a combination thereof.

Figure 11:
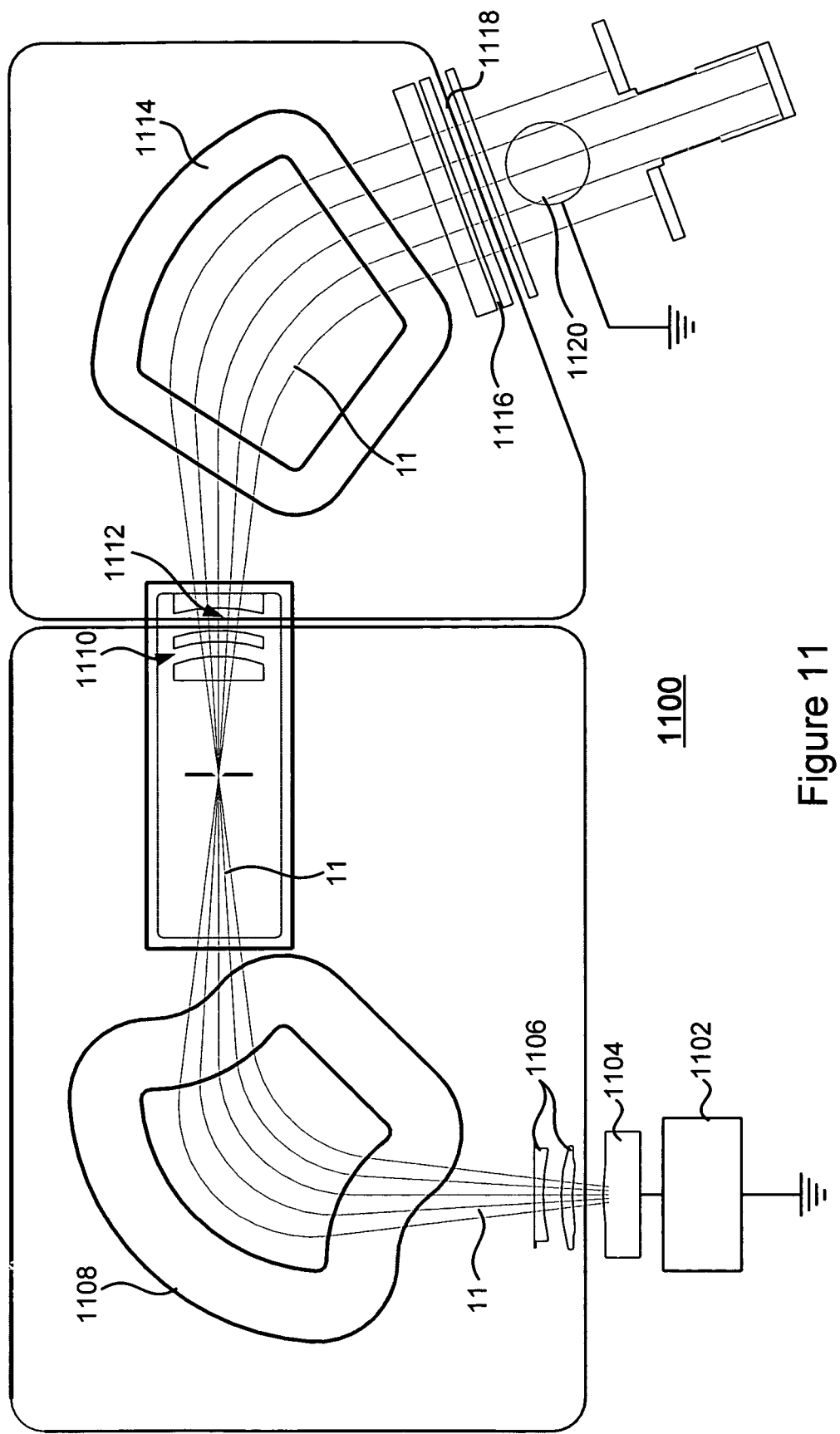
FIG. 11 illustrates one exemplary method for controlling ion beam incident angles in accordance with an embodiment of the present disclosure.

FIG. 11 illustrates an exemplary ion implanter system 1100 with multiple beam-line elements. An ion source 1104 may be held at a desired implant potential by a power supply 1102. An ion beam 11 may be generated when an extraction manipulator 1106 pulls ions from the ion source. The ion beam 11 may be purified with a 90° analyzer magnet 1108. The ion beam 11 may then pass through a first suppression stage 1110 and a first decelerator stage 1112, and may be shaped by a 70° corrector magnet 1114. Eventually, the ion beam 11 may pass through a second suppression stage 1116 and a second decelerator stage 1118 before being striking a substrate 1120 which is held at ground potential. The electrostatic fields associated with the extraction manipulator 1106 or the beam-line manipulator (e.g., 1110) may be varied to tailor the ion beam angles. If the ion implanter system 1100 is equipped with electrostatic scanner plates (not shown in FIG. 11), the shape or geometry of the scanner plates may be varied to achieve different ion beam angles.

Alternatively, the magnetic field inside the 70° corrector magnet 1114 may be varied to cause the ion beam 11 to deflect from its nominal incident angle. For example, a time-varying current may be supplied to the multi-poles (not shown) in the corrector magnet 1114 to control local magnetic fields that change the incident angles at different parts of a ribbon beam. Similarly, the positions of one or more steel rods (not shown) that shape the magnetic field inside the corrector magnet 1114 may be changed to control the ion beam angles.

According to embodiments of the present disclosure, the ion beam incident angles may be varied either continuously or incrementally. For example, if the corrector magnet 1114 is used to deflect the ion beam 11, the current that modulates the magnetic field may have either a continuous waveform or one with stepped changes. Further, the current waveform may be either slow-changing or fast-oscillating.

According to another approach, desired ion beam incident angles may be effectuated by tilting the target substrate to one or more angles with respect to the incident ion beam. FIGS. 12a-c illustrate a multi-position substrate holder 1200 in accordance with an embodiment of the present disclosure. FIG. 12a is a side view of the substrate holder 1200, FIG. 12b is a top view of the substrate holder 1200, and FIG. 12c is a simplified perspective view of a wafer 1202 on the substrate holder 1200. The substrate 1202 may be securely attached to the wafer holder 1200. An ion beam 1208 may have a normal incident angle on the substrate surface when the substrate 1202 is in its untilted position. To change incident angle of the ion beam 1208, the substrate 1202 may be tilted up and down, as shown in FIG. 12a, around a first axis 1204 which runs perpendicular to the paper. For example, if the substrate 1202 is tilted up by an angle $\theta_x$, the incident angle of the ion beam 1208 will be at $\theta_x$ with respect to the normal incidence of the substrate 1202. The substrate 1202 may also be tilted left and right, as shown in FIG. 12b, around a second axis 1206 which runs perpendicular to the paper. For example, if the substrate 1202 is tilted to the left by an angle $\theta_y$, the incident angle of the ion beam 1208 will be at $\theta_y$ with respect to the normal incidence of the substrate 1202. Optionally, a mechanical stop 1210 may be provided to restrict the lateral tilting of the substrate 1202, for example. According to some embodiments, it may be beneficial to rotate the substrate 1202 with reference to the ion beam 1208. The rotation may be started after partial implants to have an averaging effect on the angle variations and improve uniformity of dopant distribution. The rotation may be around a z-axis that is perpendicular to the substrate surface, as shown in FIG. 12c. The rotation may change the substrate orientation either continuously or incrementally. The rotation angle may be determined with consideration of a crystal lattice orientation of the substrate 1202, for example. According to embodiments of the disclosure, the tilting and/or rotation of the substrate 1202 may be implemented one at a time or in coordination with one another.

A further approach to control and vary ion beam incident angles may involve a combination of the above-described method of deflecting the ion beam with magnetic or electrostatic fields, and the method of tilting or rotating the substrate. Other ways to control and vary ion beam incident angles in accordance with embodiments of the present disclosure may also be employed as will be appreciated by those skilled in the art.

For advanced applications, the ion beam dose and energy may be varied with the different incident angles to achieve desired angle-dose and/or angle-energy distributions. Such ion beam angle-dose and/or angle-energy distributions may lead to precisely controlled dopant profiles in a substrate with an irregular surface. Dopant profiles so obtained may be free from thermal budget limits, for example, and may be used in conjunction with advanced diffusionless anneal processes.

Figure 13:
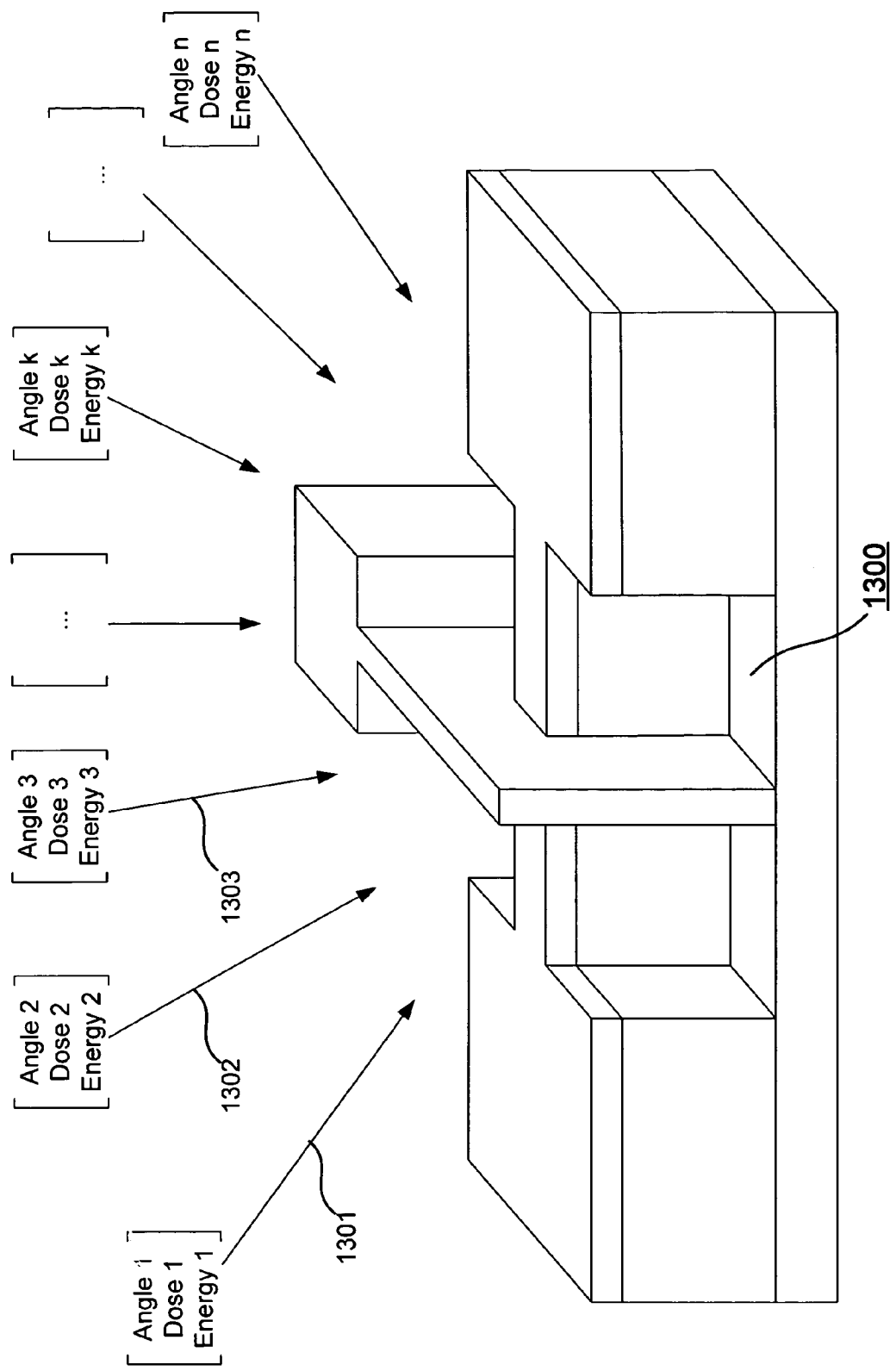
FIG. 13 illustrates an exemplary method for ion beam angle spread control for advanced applications in accordance with an embodiment of the present disclosure.

FIG. 13 illustrates an exemplary method for ion beam angle spread control for advanced applications in accordance with an embodiment of the present disclosure. In FIG. 13, there is shown a FinFET-like structure 1300 with a complex topology. To achieve a precisely controlled dopant profile, the structure 1300 may be subject to a number of ion beam conditions at different incident angles. For example, an ion beam 1301, with Energy 1, may be directed at the structure 1300 at Angle 1 and deliver an ion Dose 1; an ion beam 1302, with Energy 2, may be directed at the structure 1300 at Angle 2 and deliver an ion Dose 2; an ion beam 1303, with Energy 3, may be directed at the structure 1300 at Angle 3 and deliver an ion Dose 3; and so on. The appropriate ion energy and dose for each incident angle may be determined with mathematical simulation and/or based on empirical data. Note that, although the ion beams 1301, 1302 and 1303 etc. are depicted in FIG. 13 as separate ion beams, they may be different representations of a single ion beam. And the different ion beam conditions may be provided in a single scan pass or multiple passes.

Figure 14:
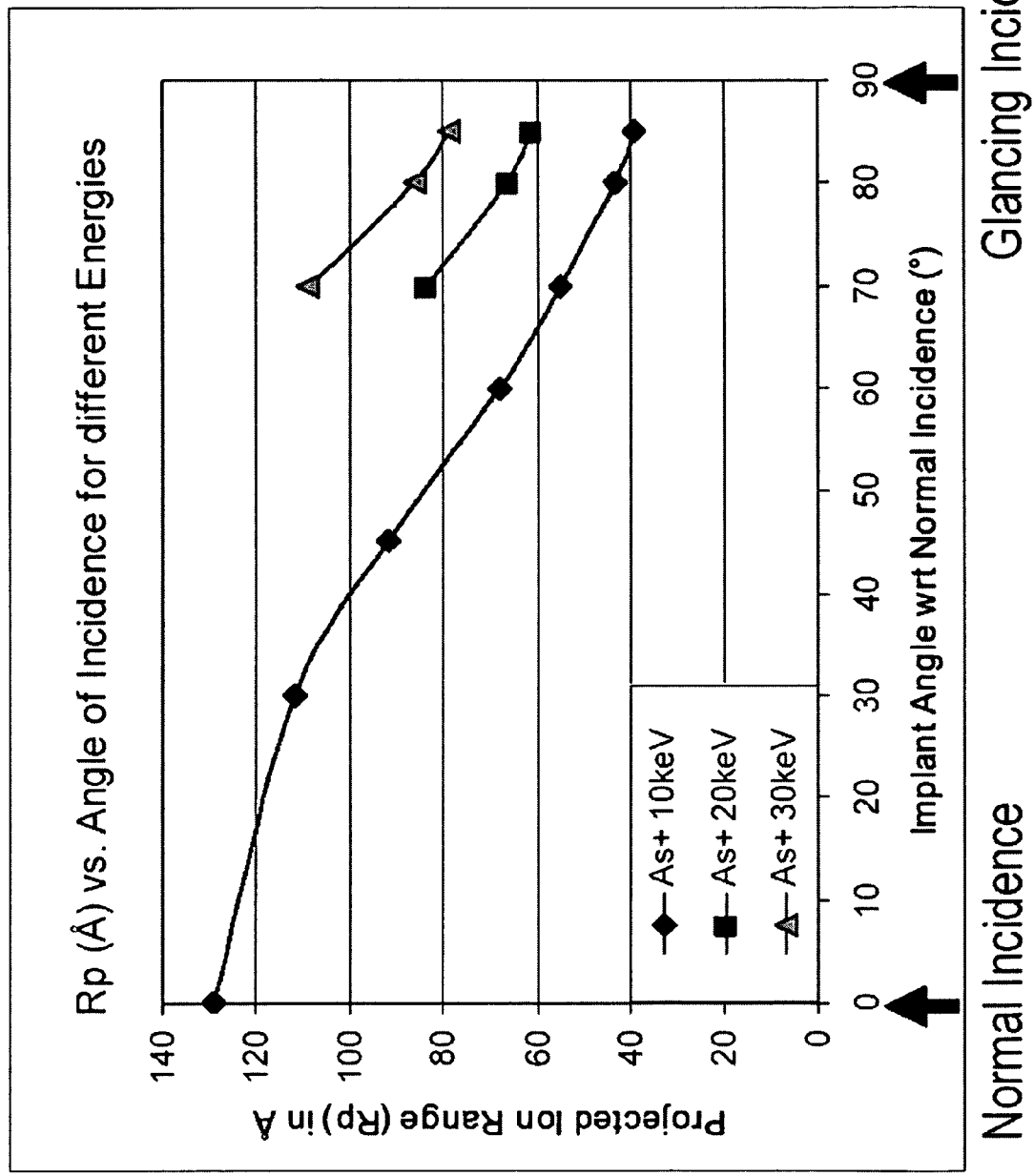
FIG. 14 illustrates an exemplary relationship between ion beam incident angles and projected ion ranges in a substrate in accordance with an embodiment of the present disclosure.

A controlled angle-energy distribution may be especially useful in conformal doping of a substrate with an irregular surface. FIG. 14 illustrates an exemplary relationship between ion beam incident angles and the projected ion range. The ions used therein are arsenic (As) ions at 10 keV, 20 keV and 30 keV. In the case of 10 keV ions, as the ion incident angles change from Normal Incidence (i.e., incident angle being zero) to Glancing Incidence (i.e., incident angle being 90°), there may be seen a steady decrease of the projected ion range from up to 130 angstrom to below 40 angstrom. A similar trend is apparent for the 20 keV and 30 keV ions. That is, as the incident angle increases, the ions become less penetrating in the substrate material. As a result, to ensure the substrate surface structures are doped evenly from all angles, it may be desirable to increase the ion energy at larger incident angles. In a specific case where the objective is to have a uniformly doped sidewall that is vertical with reference to the substrate, dopant profile uniformity may be affected by the dose losses from the top portion of the sidewalls due to reflection of ions and sputtering etc. Such dopant losses may be compensated with a larger ion beam incident angle (with no line of sight to the bottom) but a reduced energy. Alternatively, if there is too much dopant at the top, then a counterdoping species may be implanted to balance the net doping in the structure sidewall.

Figure 15:
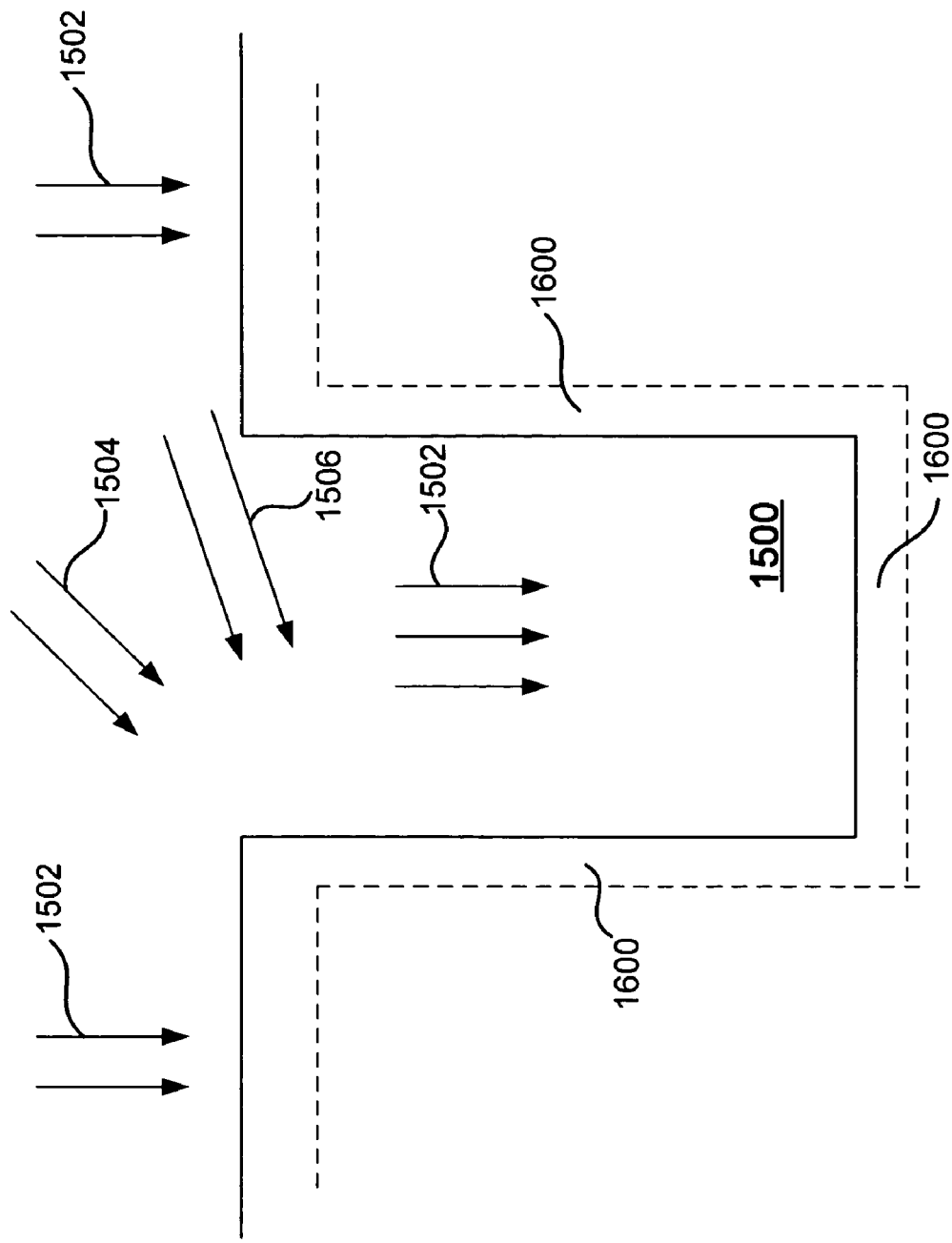
FIG. 15 illustrates an exemplary method for doping a trench structure with a controlled ion beam angle-energy distribution and angle-dose distribution in accordance with an embodiment of the present disclosure.

FIG. 15 illustrates a vertical trench structure 1500 whose dopant profile may benefit from a controlled angle-energy distribution and/or angle-dose distribution. A conformal doping of the trench 1500 may require a uniformly doped region 1600 underneath the sidewall surface as well as the trench bottom. That is, the depth and concentration of the dopants should be no different for the trench sidewall or the trench bottom. Based on the conformal doping requirement, an angle-energy distribution and an angle-dose distribution for the ion beam may be estimated and simulated. A symmetrical average angle spread may be required to ensure dopant symmetry in the sidewalls. The coverage incident angle may be perpendicular to the trench bottom though one or more large-angle ion beams (e.g., beams 1504 and 1506) may be needed to deposit dopants into the sidewalls. The large angle ion beams may have higher energy than that of normal incident beams (e.g., ion beam 1502) in order to achieve a same penetration depth in the sidewalls as in the trench bottom. It should be noted that the top surface of the wafer is typically more heavily doped than the surfaces inside the trench 1500 since the top surface, if unmasked, is exposed to ion beams of all incident angles.

The ion doses for different incident angles may be controlled in a number of ways. The ion dose received by a particular part of a substrate may be proportionate to the amount of its exposure to a scanning ion beam. Therefore, a change in the ion beam scan velocity may change the effective ion dose to some extent. Speeding up the scanning may lower the ion dose and slowing down the scanning may increase the ion dose. Alternatively, the ion extraction process may be tuned or the beam-line elements may be adjusted, which may also cause a desired change in the ion doses.

Figure 18:
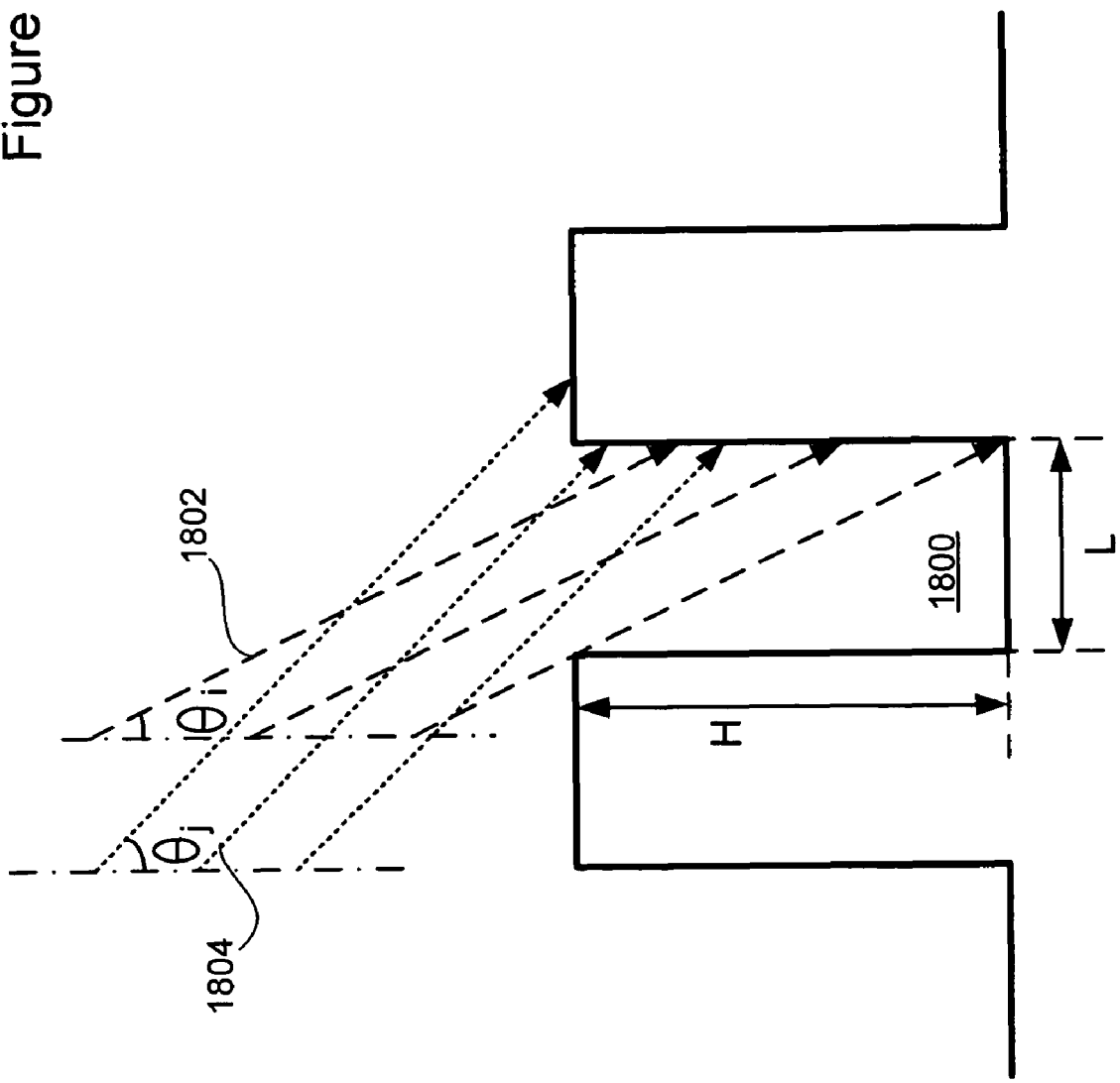
FIG. 18 illustrates an exemplary method for doping a trench structure with multiple ion beams in accordance with an embodiment of the present disclosure.

According to embodiments of the present disclosure, it is often beneficial to adapt the choice of beam angles to the substrate surface topology. One example is shown in FIG. 18 where an ion beam 1802 may be tilted up to an incident angle $\Theta_i$ to have a line of sight of a complete sidewall of a trench structure 1800. The maximum incident angle $\Theta_i$ may be determined by the trench's aspect ratio H/L. To compensate for the afore-mentioned ion dose difference between the top and bottom portions of the trench 1800, one or more additional ion beams (e.g., 1804) with greater incident angles (e.g., $\Theta_j$) but less energy than the ion beam 1802 may be utilized. With the ion beam angles and energies adapted based on the trench geometry and ion dose losses, a desired dopant profile may be achieve at the bottom of the trench as well as on the sidewalls.

To minimize angle variations from wafer to wafer or from setup to setup, the controlled spread of ion beam incident angles may be treated as a key process parameter that may be used in ion beam setup and/or real-time adjustment in order to maintain process repeatability. Once a desired angle spread has been determined and/or tested, each subsequent implantation run may be set up according to the desired angle spread.

Figure 16:
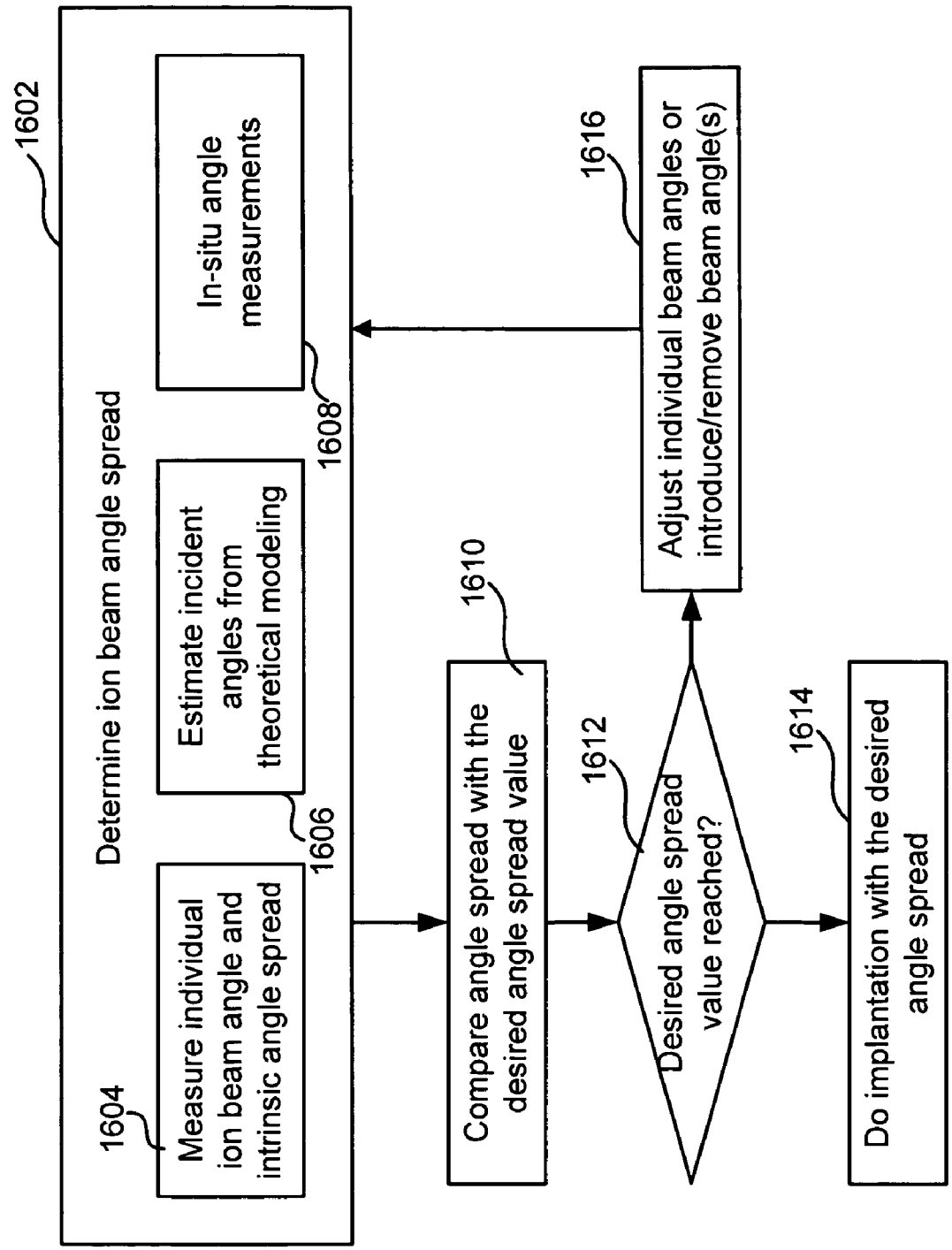
FIG. 16 is a flow chart illustrating an exemplary method for ion beam angle process control in accordance with an embodiment of the present disclosure.

FIG. 16 illustrates an exemplary method for ion beam angle process control in accordance with an embodiment of the present disclosure. In step 1602, a current ion beam angle spread may be determined. The step 1602 may include one or more sub-steps which may be implemented individually or in combination. As described above, the ion beam angle spread may be caused by one or more ion beams with different incident angles and intrinsic angle spreads. In sub-step 1604, each individual ion beam angle and its intrinsic angle spread may be separately measured. The effect of the individual beam angles (or component beam angles) may be aggregated to determine the current ion beam angle spread. Alternatively, in sub-step 1606, the individual incident angles may be estimated from theoretical modeling of beam-line parameters. Or, in sub-step 1608, the current ion beam angle spread may be directly measured using in-situ metrology. Then, in step 1610, the current angle spread may be compared with a desired angle spread. The desired angle spread may be defined by an establish set of process parameters that reflect a previously tested angle spread. If it is determined in step 1612 that the desired angle spread has been reached, the implantation may proceed with the desired angle spread in step 1614. Otherwise, the individual beam angles or angle spreads may be adjusted, in step 1616, to generated the desired angle spread. The adjustment may involve introduction or removal of one or more individual beam angles to change the overall angle spread, and may be achieved by tuning the beam-line elements and/or adjusting the substrate orientation during one or more scans through the ion beam. The method steps of 1616, 1602 (including one or more of sub-step 1604, 1606 and 1608) and 1610 may be repeated until the desired angle spread has been reached.

The method steps illustrated in FIG. 16 may be carried out either during an initial setup of an ion implanter system or in substantial real-time during the ion implantation. In a real-time implementation, a feedback loop may be established to actively control and maintain the ion beam angle spread.

Figure 17:
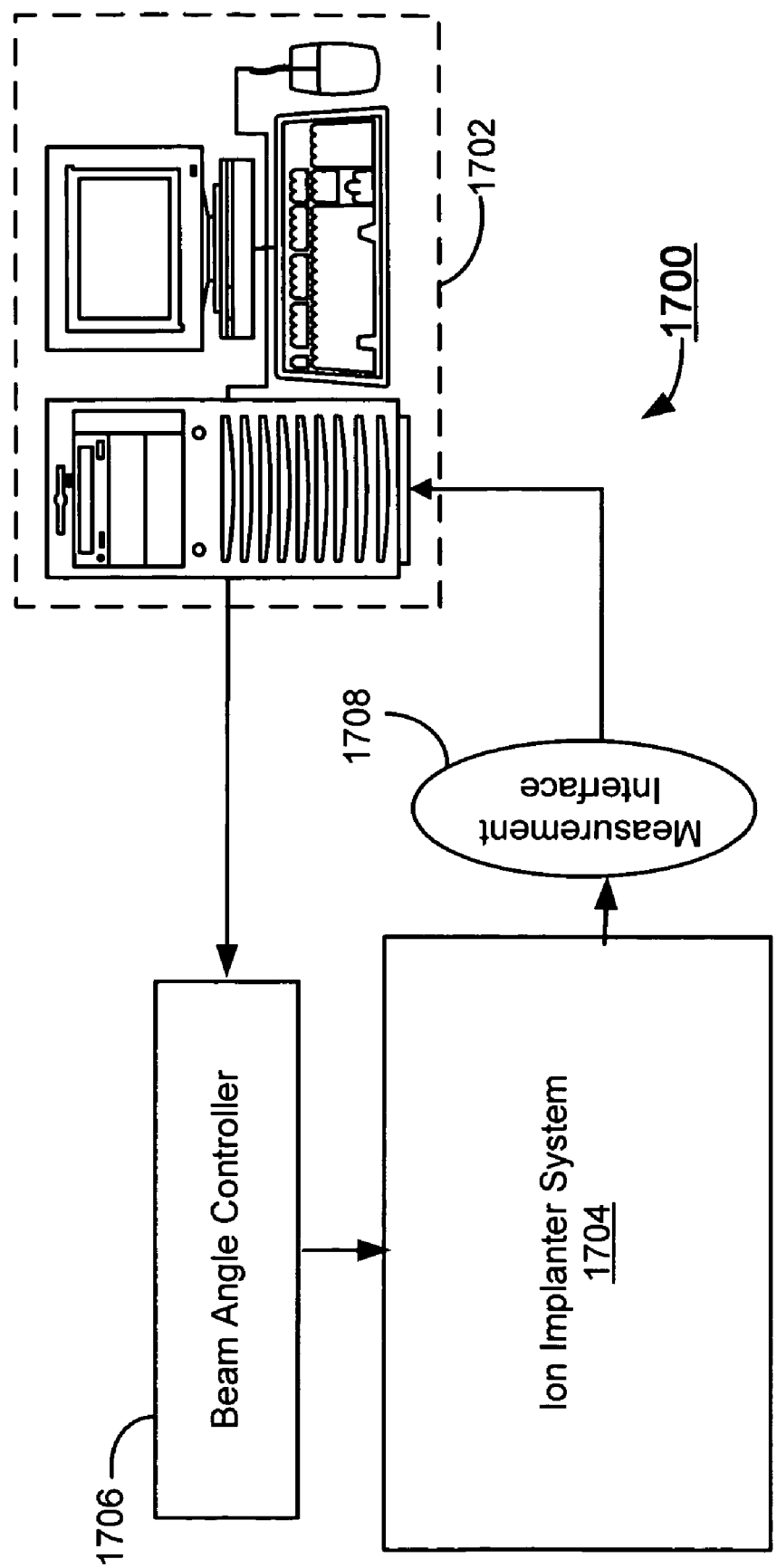
FIG. 17 is a block diagram illustrating an exemplary system for ion beam angle spread control and/or process control in accordance with an embodiment of the present disclosure.

FIG. 17 is a block diagram illustrating an exemplary system 1700 for ion beam angle spread control and/or process control in accordance with an embodiment of the present disclosure. The system 1700 may comprise a processor unit 1702 which may be a microprocessor, micro-controller, personal computer (PC) or any other processing device. The system 1700 may also comprise a beam angle controller 1706 that makes adjustments to an ion implanter system 1704 according to instructions received from the processor unit 1702. The system 1700 may further comprise a measurement interface 1708 through which the processor unit 1702 may receive measurement data from the ion implanter system 1704.

In operation, the processor unit 1702 may determine a desired ion beam angle spread based either on a theoretical simulation or historical angle spread data. Then, the processor unit 1702 may instruct the beam angle controller 1706 to run one or more test scans in the ion implanter system 1704, and may receive ion beam angle measurements via the measurement interface 1708. The processor unit 1702 may determine a current angle spread and identify adjustment actions to be taken by the beam angle controller 1706 in order to achieve the desired angle spread. The adjustment actions may then be executed by the beam angle controller 1706, and the resulting measurement data may be examined by the processor unit 1702 to determine whether further adjustment is necessary. In addition to angle adjustments, the beam angle controller 1706 may also cause changes in ion energy and ion dose together with incident angles, thereby realizing desired angle-energy distributions and angle-dose distributions as dictated by the processor unit 1702.

At this point it should be noted that the technique for ion beam angle spread control in accordance with the present disclosure as described above typically involves the processing of input data and the generation of output data to some extent. This input data processing and output data generation may be implemented in hardware or software. For example, specific electronic components may be employed in an ion implanter system or similar or related circuitry for implementing the functions associated with ion beam angle spread control in accordance with the present disclosure as described above. Alternatively, one or more processors operating in accordance with stored instructions may implement the functions associated with ion beam angle spread control in accordance with the present disclosure as described above. If such is the case, it is within the scope of the present disclosure that such instructions may be stored on one or more processor readable carriers (e.g., a magnetic disk), or transmitted to one or more processors via one or more signals.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A method for ion beam angle spread control, the method comprising:
    directing one or more ion beams at a substrate surface, each of the one or more ion beams having a plurality of beamlets, the plurality of beamlets simultaneously directed at a portion of the substrate surface at with a spread of two or more different incident angles configured to simultaneously expose the portion of the substrate surface to a distribution of incident angles in the plurality of beamlets, wherein said incident angles are adjusted by deflecting said beamlets during beam scanning.

2. The method according to claim 1, wherein the two or more incident angles are introduced by deflecting at least one of the one or more ion beams with a varying magnetic field.

3. The method according to claim 1, wherein the two or more incident angles are introduced by deflecting at least one of the one or more ion beams with a varying electrostatic field.

4. The method according to claim 1, further comprising tilting the substrate plane to two or more different angles with respect to at least one of the one or more ion beams.

5. The method according to claim 1 further comprising:
    rotating the substrate surface to one or more predetermined orientations.

6. The method according to claim 1, wherein the two or more different incident angles are introduced during one or more scans of the substrate surface.

7. The method according to claim 1, wherein the two or more different incident angles comprise substantially continuous ion beam incident angles.

8. The method according to claim 1, wherein the two or more different incident angles comprise incrementally varied ion beam incident angles.

9. The method according to claim 1 further comprising:
    scanning an ion beam at a first rate across the substrate surface; and varying an incident angle associated with the ion beam at a second rate that is substantially faster than the first rate.

10. The method according to claim 1 further comprising:
    scanning two or more ion beams simultaneously across the substrate surface, wherein each of the two or more ion beams strike the substrate surface at a predetermined incident angle.

11. At least one processor readable carrier for storing a computer program of instructions configured to be readable by at least one processor for instructing the at least one processor to execute a computer process for performing the method as recited in claim 1.

12. A system for ion beam angle spread control, the system comprising:
    means for directing one or more ion beams at a substrate surface, each of the one or more ion beams having a plurality of beamlets, the plurality of beamlets simultaneously directed at a portion of the substrate surface with a spread of two or more different incident angles configured to simultaneously expose the portion of the substrate surface to a distribution of incident angles in the plurality of beamlets, wherein said incident angles are adjusted by deflecting said beamlets during beam scanning.

13. The system according to claim 12, wherein the two or more incident angles are introduced by deflecting at least one of the one or more ion beams with a varying magnetic field.

14. The system according to claim 12, wherein the two or more incident angles are introduced by deflecting at least one of the one or more ion beams with a varying electrostatic field.

15. The system according to claim 12, further comprising means for tilting the substrate plane to two or more different angles with respect to at least one of the one or more ion beams.

16. The system according to claim 12 further comprising:
    means for rotating the substrate surface to one or more predetermined orientations.

17. The system according to claim 12, wherein the two or more different incident angles are introduced during one or more scans of the substrate surface.

18. The system according to claim 12 further comprising:
    means for scanning an ion beam at a first rate across the substrate surface; and means for varying an incident angle associated with the ion beam at a second rate that is substantially faster than the first rate.

19. The system according to claim 12 further comprising:
    means for scanning two or more ion beams simultaneously across the substrate surface, wherein each of the two or more ion beams strike the substrate surface at a predetermined incident angle.

* * * * *